(12) United States Patent
Nishikawa et al.

(10) Patent No.: US 10,811,889 B2
(45) Date of Patent: Oct. 20, 2020

(54) MANAGEMENT DEVICE AND POWER STORAGE SYSTEM

(71) Applicant: Panasonic Intellectual Property Management Co., Ltd., Osaka (JP)

(72) Inventors: Shinya Nishikawa, Osaka (JP); Yusuke Itakura, Osaka (JP); Takashi Iida, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/275,242

(22) Filed: Feb. 13, 2019

(65) Prior Publication Data

US 2019/0181663 A1 Jun. 13, 2019

Related U.S. Application Data

(63) Continuation of application No. PCT/JP2017/030020, filed on Aug. 23, 2017.

(30) Foreign Application Priority Data

Aug. 30, 2016 (JP) ................. 2016-168510

(51) Int. Cl.
*H02J 7/00* (2006.01)
*H01M 10/44* (2006.01)
(Continued)

(52) U.S. Cl.
CPC ........ *H02J 7/0026* (2013.01); *G01R 31/3835* (2019.01); *G01R 31/392* (2019.01);
(Continued)

(58) Field of Classification Search
CPC ...... H02J 7/0021; H02J 7/0022; H02J 7/0026; G01R 31/392; G01R 31/396; G01R 31/3835
(Continued)

(56) References Cited

U.S. PATENT DOCUMENTS

2004/0001996 A1\* 1/2004 Sugimoto ............... B60L 58/15
429/61
2009/0155674 A1 6/2009 Ikeuchi et al.
(Continued)

FOREIGN PATENT DOCUMENTS

JP 2010-231939 10/2010
JP 2013-117410 6/2013
(Continued)

OTHER PUBLICATIONS

International Search Report of PCT application No. PCT/JP2017/030020 dated Nov. 21, 2017.

*Primary Examiner* — Edward Tso
*Assistant Examiner* — Aaron Piggush
(74) *Attorney, Agent, or Firm* — McDermott Will & Emery LLP (57) ABSTRACT

A smoothing unit smoothes a detected voltage of each power storage block based on previous data during a certain period. A calculator calculates a difference between a smoothing voltage of one power storage block in the n power storage blocks and a representative value of the smoothing voltages of the other power storage blocks or all the power storage blocks. A determination unit determines a power storage block whose difference against the representative value enlarges more than or equal to a set value during a predetermined period as a power storage block containing an abnormal power storage cell.

10 Claims, 4 Drawing Sheets

(51) Int. Cl.
  *H02H 7/18* (2006.01)
  *G01R 31/392* (2019.01)
  *H01M 10/48* (2006.01)
  *G01R 31/396* (2019.01)
  *G01R 31/3835* (2019.01)

(52) U.S. Cl.
  CPC .......... *G01R 31/396* (2019.01); *H01M 10/44* (2013.01); *H01M 10/48* (2013.01); *H02H 7/18* (2013.01); *H02J 7/00* (2013.01); *H02J 7/0021* (2013.01); *H02J 7/0022* (2013.01)

(58) Field of Classification Search
  USPC ................................ 320/116, 132, 134, 157
  See application file for complete search history.

(56) References Cited

U.S. PATENT DOCUMENTS

| | | | |
|---|---|---|---|
| 2012/0175953 A1* | 7/2012 | Ohkawa | B60L 3/0046 307/18 |
| 2014/0184235 A1 | 7/2014 | Ikeuchi et al. | |
| 2015/0162759 A1* | 6/2015 | Fujii | H01M 10/425 320/118 |

FOREIGN PATENT DOCUMENTS

| | | |
|---|---|---|
| JP | 2014-064404 | 4/2014 |
| JP | 2014-112093 | 6/2014 |
| WO | 2011/037257 | 3/2011 |

* cited by examiner

MANAGEMENT DEVICE AND POWER STORAGE SYSTEM

TECHNICAL FIELD

The present invention relates to a management device for managing a power storage unit and to a power storage system.

BACKGROUND ART

In recent years, secondary batteries such as a lithium ion battery or a nickel hydride battery have been used for various purposes. The secondary battery is used for, for example, an on-vehicle (including an electric bicycle) for supplying electric power to a drive motor of an electric vehicle (EV), a hybrid electric vehicle (HEV), or a plug-in hybrid vehicle (PHV), a power storage for a peak-shift or a backup, and a frequency regulation (FR) for frequency stabilization of a system, and so on.

With respect to the secondary battery such as the lithium ion battery, a micro short circuit is sometimes generated in the battery due to contact between a positive electrode and a negative electrode by a displacement of a separator, generation of a conductive path by contamination of a foreign substance into the battery, or the like. The micro short circuit causes overheating and a state of the micro short circuit sometimes changes into a state of a complete short circuit due to a change of an orientation of the foreign substance.

The micro short circuit is typically detected on the basis of a change of a cell voltage or a state of charge (SOC) during a period of suspension of a charge and discharge (refer to, for example, PTL 1). The conductive path is formed between the positive electrode and the negative electrode of the battery when the micro short circuit is generated. Therefore, in the battery in which the micro short circuit is generated, an electric current flows also during the suspension of the charge and discharge to reduce a voltage and the SOC. Further, a method for detecting the micro short circuit on the basis of a rate of increase of the cell voltage during charge continuation or a rate of decrease of the cell voltage during discharge continuation is also suggested (refer to, for example, PTL 2).

CITATION LIST

Patent Literature

PTL 1: Unexamined Japanese Patent Publication No. 2014-112093

PTL 2: Unexamined Japanese Patent Publication No. 2010-231939

SUMMARY OF THE INVENTION

There is a system that continues to charge and discharge 24 hours among power storage systems used for FR. In FR, the discharge from the power storage system to a power grid and the charge from the power grid to the power storage system are irregularly generated according to frequency or a voltage of the power grid. Thus, in the power storage system that has a short period of suspension and in which the charge and discharge are generated in an irregular pattern, it is difficult to detect the micro short circuit by the described method. Similarly, in a case where a cell leaks in electricity, it is also difficult to detect the micro short circuit.

The present invention has been accomplished in view of the above situation, and an object of the present invention is to provide a technique of detecting an abnormality in a cell even during charging or discharging.

To solve the problem mentioned above, according to an aspect of the present invention, a management device is configured to manage a power storage module including n power storage blocks series-connected, where n is an integer of 2 or greater, each of the power storage blocks containing m power storage cells parallel-connected, where m is an integer of 1 or greater, and the management device includes a voltage detector that detects each voltage of the n power storage blocks, a smoothing unit that smoothes the detected voltage of each of the power storage blocks based on previous data during a certain period, a calculator that calculates difference between a smoothing voltage of one power storage block in the n power storage blocks and a representative value of smoothing voltages of the other power storage blocks or all the power storage blocks, and a determination unit that determines the power storage block whose difference against the representative value enlarges more than or equal to a set value during a predetermined period as the power storage block containing the abnormal power storage cell.

Any desired combinations of the above-described components and converted expressions of the present invention in methods, devices, systems, and other similar entities are still effective as aspects of the present invention.

According to the present invention, it is possible to detect abnormality in a cell without considering a state of an electric current.

DESCRIPTION OF EMBODIMENT

Figure 1:
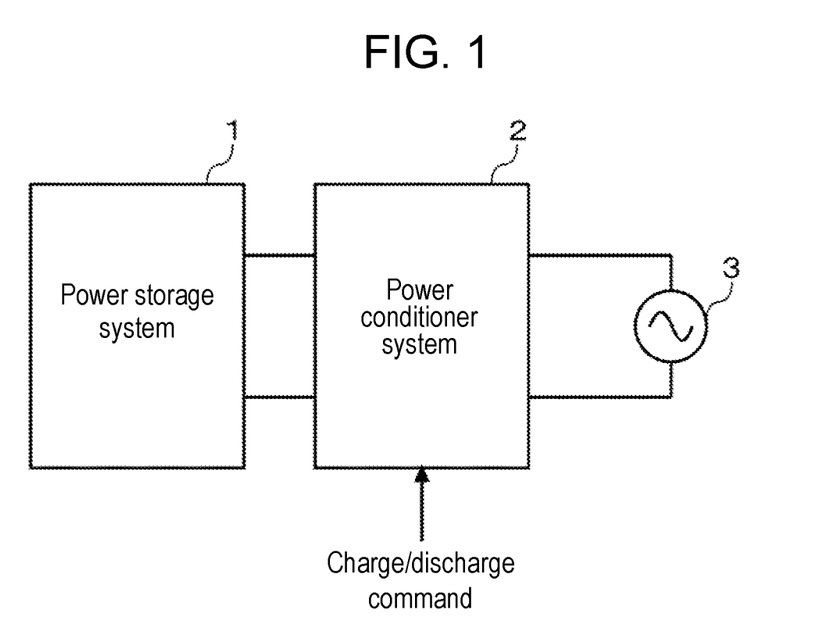
FIG. 1 is a view illustrating an example of use of a power storage system according to an exemplary embodiment of the present invention.

FIG. 1 is a view illustrating an example of use of power storage system 1 according to an exemplary embodiment of the present invention. Power storage system 1 shown in FIG. 1 is used for FR and connected to system 3 through power conditioner system 2. Power conditioner system 2 includes a bidirectional inverter, and converts DC power supplied from power storage system 1 into AC power to supply the converted AC power to power grid 3 when power storage system 1 is discharged. Further, power conditioner system 2 converts AC power supplied from power grid 3 into DC power to supply the converted DC power to power storage system 1 when power storage system 1 is charged.

Since a power supplier, such as a power company, needs to stably supply power, the power supplier needs to maintain frequency and voltage of power grid 3 within a certain range. In a case where power grid 3 is connected to many power generation facilities of renewable energy, the amount of power generation greatly changes according to weather conditions. Power storage system 1 is used as means for stabilization of the power grid.

Particularly, in USA, independent system operators (ISO) or regional transmission organization (RTO) has started market transactions of ancillary services. The ISO or the RTO notifies a power command per several seconds to power conditioner system 2 of power storage system 1 procured by a bid to restrain system frequency from changing. Specifically, in a case where the power grid frequency decreases, the ISO or the RTO notifies a discharge command, and in a case where the power grid frequency increases, the ISO or the RTO notifies a charge command.

Figure 2:
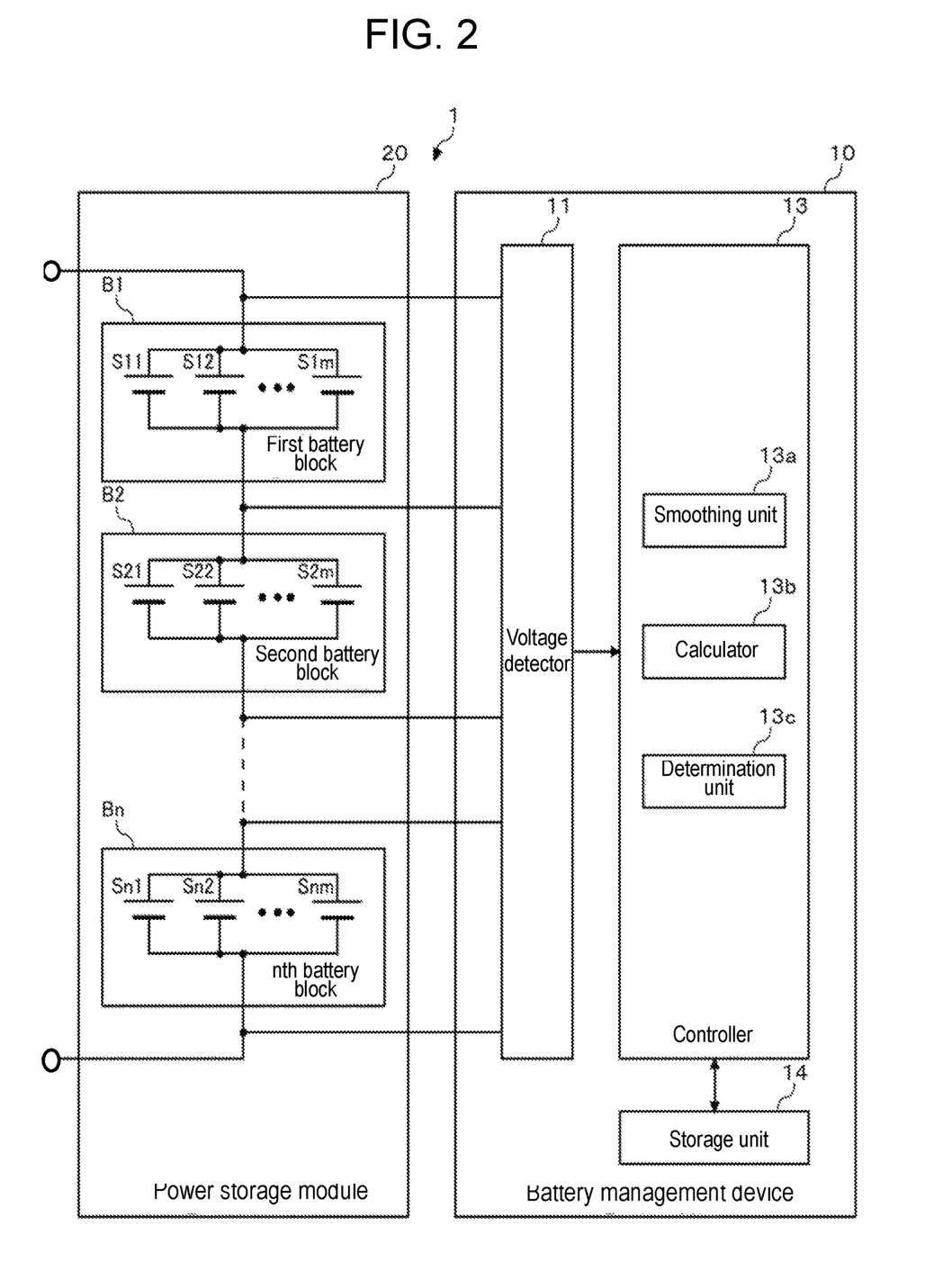
FIG. 2 is a view illustrating an example of a configuration of the power storage system according to the exemplary embodiment of the present invention.

FIG. 2 is a view illustrating an example of a configuration of power storage system 1 according to the exemplary embodiment of the present invention. Power storage system 1 includes power storage module 20 and battery management device 10. Power storage module 20 is configured to connect n (n is an integer greater than or equal to 2) battery blocks (first battery block B1, second battery block B2, ... , nth battery block Bn) in series. First battery block B1 is configured to connect m (m is an integer greater than or equal to 1) battery cells S11 to S1m in parallel. Similarly, each of second battery block B2 and nth battery block Bn includes m parallel-connected battery cells. For example, lithium ion battery cells, nickel hydride battery cells, and lead battery cells may be used for the battery cells. Herein, the battery cells are assumed to be lithium ion battery cells, for example. In FIG. 2, one power storage module 20 is shown. However, power storage module 20 may be further connected in series with a plurality of other power storage modules to increase output voltage.

Battery management device 10 includes voltage detector 11, controller 13, and storage unit 14. Voltage detector 11 detects a detecting voltage of each of battery blocks B1, B2, ..., Bn at a predetermined sampling cycle (for example, 1 second cycle) and outputs the detecting voltage to controller 13. Controller 13 includes smoothing unit 13a, calculator 13b, and determination unit 13c. A configuration of controller 13 may be realized by either cooperation of hardware and software resources or hardware resources only. A microcomputer, a digital signal processor (DSP), a field programmable gate array (FPGA), or another large scale integration (LSI) can be used as the hardware resource. A program such as firmware can be used as the software resource. Storage unit 14 can be realized by a read-only memory (ROM) and a random-access memory (RAM), and, according to the present exemplary embodiment, storage unit 14 is used as a work area of smoothing unit 13a, calculator 13b, and determination unit 13c.

Smoothing unit 13a smoothes the voltage of each of battery blocks B1, B2, ..., Bn detected by voltage detector 11 based on previous data during more than or equal to a certain period (for example, 10 hours, 12 hours, or 24 hours) to produce a smoothing voltage. Smoothing unit 13a smoothes the voltage of each of battery blocks B1, B2, ... , Bn using, for example, a linear low-pass filter of the following (equation 1).

$$V\sim(t)=\alpha V(t)+(1\cdot\alpha)V\sim(t-1) \quad \text{(equation 1)}$$

$$0<\alpha<1$$

The more α approaches 0, the more increasing smoothing intensity becomes, and the more α approaches 1, the more decreasing the smoothing intensity becomes.

Incidentally, the above (equation 1) is an example of smoothing processing and different smoothing processing may be used. The smoothing voltage may be produced by, for example, calculating a moving average of the detecting voltage during a certain period.

Calculator 13b calculates a representative value of the smoothing voltages of the other battery blocks except for the smoothing voltage of the target battery block among the smoothing voltages of n battery blocks B1, B2, ..., Bn. For example, as the representative value, a median of the smoothing voltages of the other battery blocks is calculated. Unlike the above, as the representative value, an average value of the smoothing voltages of the other battery blocks may be used. At the case, the average value may be calculated except a maximum value and a minimum value of the smoothing voltages of the other battery blocks. Calculator 13b calculates difference between the smoothing voltage of the target battery block and the representative value of the smoothing voltages of the other battery blocks.

Determination unit 13c determines the target battery block as a battery block containing a battery cell that minutely (or in a micro state) short-circuits when the above difference enlarges more than or equal to a set value during a predetermined period. The target battery block is determined as the battery block containing the battery cell that minutely (or in a micro state) short-circuits when the difference enlarges, for example, more than or equal to 5 mV per 12 hours. Incidentally, criteria for determination depend on specifications and parallel number of batteries. The larger capacity and/or parallel number of the batteries become, the smaller influence of a discharge due to the micro short circuit becomes, so that an inclination of a difference change with respect to a determination period as the criteria for determination is set gradual. On the contrary, the smaller capacity and/or parallel number of the batteries become, the steeper the inclination of the difference change with respect to the determination period as the criteria for determination is set.

Figure 3:
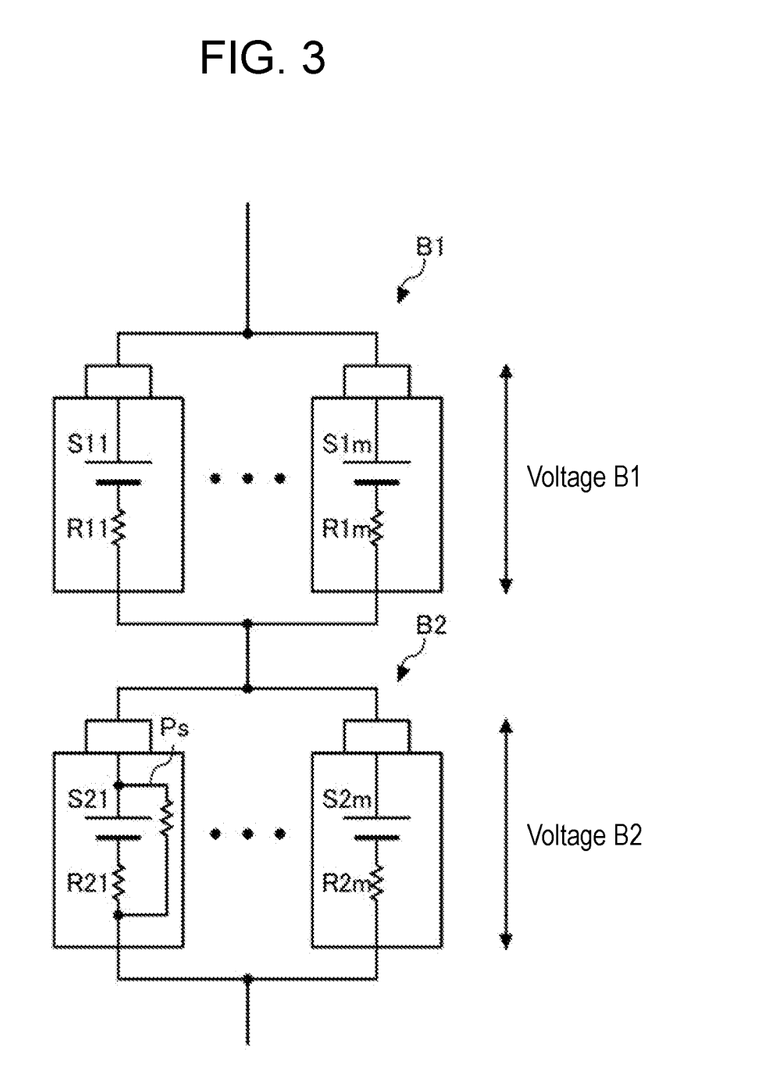
FIG. 3 is a view illustrating an example of an abnormality occurring in a battery cell.

FIG. 3 is a view illustrating an example of abnormality occurring in the battery cell. An example of a state where two battery blocks of first battery block B1 and second battery block B2 are connected in series as shown in FIG. 3 will be described hereinafter. As shown in FIG. 2, each battery cell that constitutes each of the battery blocks has internal resistance R11 to Rnm.

When the micro short circuit occurs at battery cell S21 in second battery block B2, an electric current starts flowing through micro short circuit path Ps formed inside battery cell S21. Thus, in second battery block B2, the discharge is generated at micro short circuit path Ps in battery cell S21 in addition to a self-discharge by internal resistances R21 to R2m of each of the battery cells. As a result, a voltage drop of second battery block B2 becomes larger than that of first battery block B1.

Figure 4:
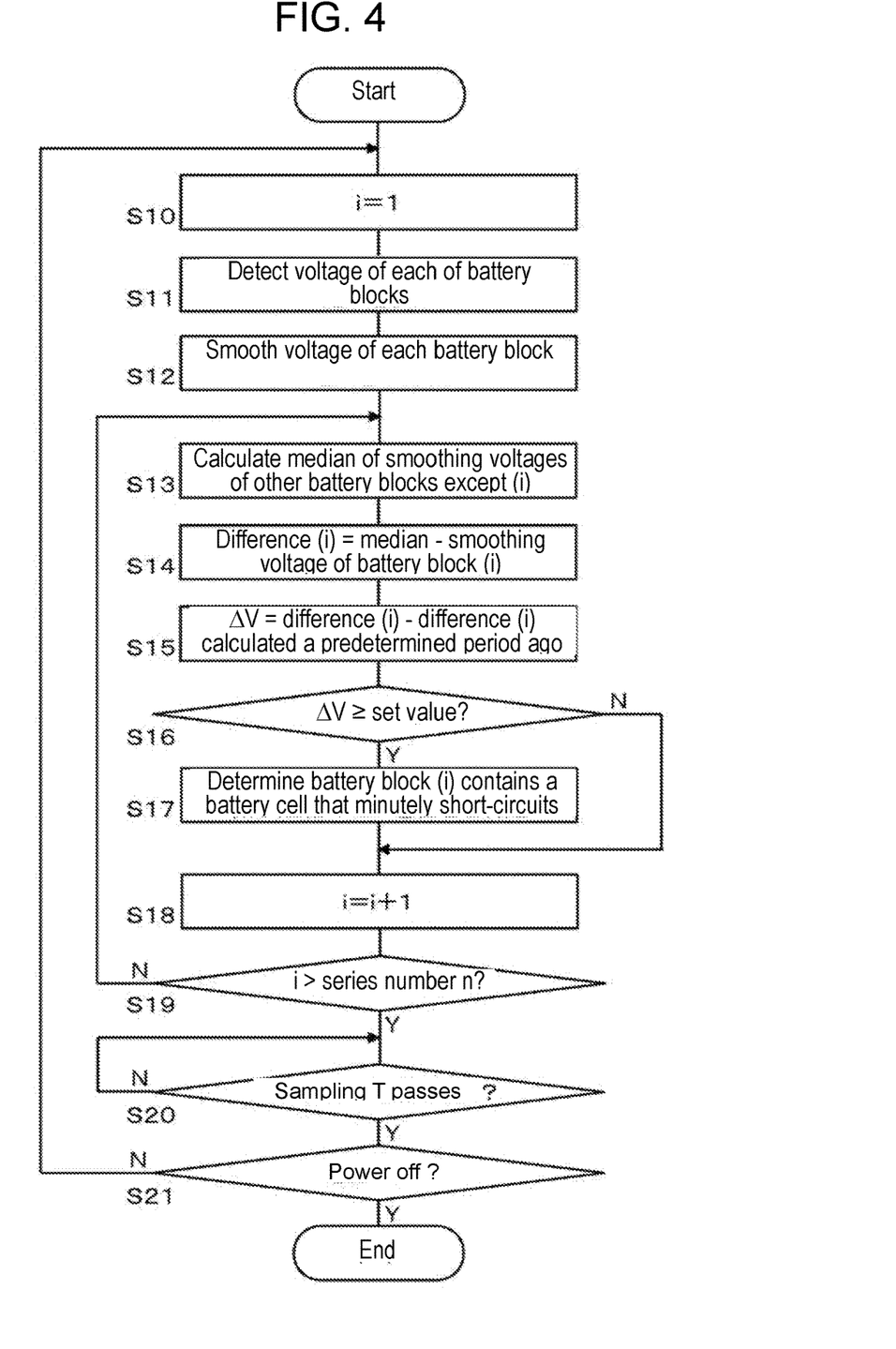
FIG. 4 is a flowchart illustrating a flow of a method of micro short circuit detection performed by a battery management device according to the exemplary embodiment of the present invention.

FIG. 4 is a flowchart illustrating a flow of a method of micro short circuit detection performed by battery management device 10 according to the exemplary embodiment of the present invention. 1 is set to variable i as an initial value (S10). Voltage detector 11 detects voltage of each of the n battery blocks (S11). Smoothing unit 13a smoothes the voltage of each battery block to produce the smoothing voltage. (S12).

Calculator 13b calculates the median of the smoothing voltages of the other battery blocks except for battery block (i) (S13). Calculator 13b calculates difference (i) by subtracting the smoothing voltage of battery block (i) from the calculated median (S14). Calculator 13b calculates change value ΔV of difference (i) by subtracting difference (i) that is calculated a predetermined period ago from difference (i) that is presently calculated (S15). Determination unit 13c determines whether or not change value ΔV of difference (i) is more than or equal to a set value (S16). The set value is set to a value derived by a designer based on the specifications of the batteries, the parallel number of the batteries, and experimental data or simulation data of, for example, flowing current in a case where the micro short circuit is generated in the battery.

When change value ΔV of difference (i) is more than or equal to the set value (Y of S16), determination unit 13c determines that battery block (i) contains a battery cell that minutely (or in a micro state) short-circuits (S17). Determination unit 13c notifies generation of the micro short circuit to a higher rank device (according to the present exemplary embodiment, power conditioner system 2 corresponds to the higher rank device). When change value ΔV of difference (i) is less than the set value (N of S16), processing of step S17 is skipped.

Variable i is incremented (S18), and it is determined whether or not variable (i) is beyond the number of series connections n (S19). When variable i is less than or equal to the number of series connections n (N of S19), a process proceeds to step S13 to continue determination processing of the micro short circuit of another battery block. When variable i is more than the number of series connections n (Y of S19), after sampling period passes (Y of S20), the process proceeds to step S10 (N of S21) to detect a new voltage. When battery management device 10 is turned off (Y of S21), micro short-circuit detection processing ends. Although a determination condition of power off is described at step S21 in FIG. 4, the micro short-circuit detection processing ends whenever battery management device 10 is turned off.

According to the present exemplary embodiment, the smoothing voltage formed by smoothing the voltage during a certain period is used, as described above. Therefore, influence of status (the charge, the discharge, and a stop) when the voltage detected can be removed. As a result, the micro short circuit of the battery cell can be detected independently of a condition of current. Namely, the charge and the discharge need not be divided each other, and it can be uniformly determined whether or not the micro short circuit is generated without suffering limitation of a current value. Since there is no limitation of the current value, the present exemplary embodiment can be applied to a use that always charges and discharges. Further, since the smoothing voltage whose change is smaller than that of the detected voltage is used, the present exemplary embodiment can be applied to a use, such as FR, in which the charge and the discharge change irregularly and severely. Incidentally, not being limited to the FR use, the same algorithm can be applied to an on-vehicle use and a stationary type use to increase versatility.

Further, by using only a voltage detection function of the battery block commonly used, the micro short circuit can be detected, so that it is not necessary to add a special hardware for detecting abnormality. Further, since a characteristic amount (a change amount of the smoothing voltage) used in the present exemplary embodiment immediately changes when the micro short circuit is generated, the micro short circuit can be detected in a short time. On the contrary, it takes a lot of time to detect based on the difference between the smoothing voltage of the target battery block and the representative value of the smoothing voltages of the other battery blocks. Since variation of the voltage of the battery block is generated due to temperature, deterioration, or the like, it needs a lot of time to decide occurrence of the difference between the voltages of the battery blocks due to the micro short circuit.

The present invention has been described based on the exemplary embodiment. It is to be understood to a person with ordinary skill in the art that the exemplary embodiment is an example, and various modified examples of each of component elements and combinations of each treatment process may be made and the modified examples are included within the scope of the present invention.

According to the exemplary embodiment described above, it is determined whether or not the micro short circuit is generated in the battery cell included in the target battery block by comparing the smoothing voltage of the target battery block and the representative value of the smoothing voltages of the other battery blocks. At this point, it may be determined whether or not the micro short circuit is generated in the battery cell included in the target battery block by comparing a smoothing SOC of the target battery block and a representative value of the smoothing SOCs of the other battery blocks.

An SOC of each battery block can be estimated by an open circuit voltage (OCV) method. A relation between an open-circuit voltage and the SOC of the battery is stable, so that the SOC can be estimated by detecting the open-circuit voltage. Incidentally, although the SOC can be calculated by also a current integration method, a position of the battery block in which the micro short circuit is generated can not be specified in the series-connected battery blocks from the detected current value.

According to the exemplary embodiment described above, it is determined whether or not the micro short circuit is generated in the battery cell included in the target battery block by comparing the smoothing voltage/SOC of the target battery block and the representative value of the smoothing voltages/SOCs of the other battery blocks. At this point, it may be determined whether or not the micro short circuit is generated in the battery cell included in the target battery block by comparing the smoothing voltage/SOC of the target battery block and a representative value of the smoothing voltage/SOCs of all the battery blocks.

In the case where the smoothing voltage/SOC of the target battery block is compared with the representative value of the smoothing voltages/SOCs of the other battery blocks not including the target battery block, difference between both of them can be increased. On the other hand, in the case where the smoothing voltage/SOC of the target battery block is compared with the representative value of the smoothing voltages/SOCs of all the battery blocks, computational complexity can be reduced since the calculation of the representative is completed at one time.

Further, according to the exemplary embodiment described above, although the example in which the battery block including one or more battery cells is used as the power storage module is assumed, a power storage block including one or more capacitor cells (for example, electric double layer capacitor cells, lithium-ion capacitor cells) may be used.

A series of processes that is described above from the smoothing processing of the voltage/SOC of the target battery block to the determination processing for determining whether or not the micro short circuit is generated, may be executed only when the voltage/SOC of the target battery block fits within a predetermined range. For example, the above described series of processes is executed when the voltage/SOC of the target battery block fits within a range of a predetermined intermediate region (for example, a voltage region corresponding to SOC 10% to 90%, more preferably a voltage region corresponding to SOC 30% to 70%), and the series of processes is stopped when the voltage/SOC of the target battery block exceeds the range of the predetermined intermediate region. The voltage severely changes in a low-SOC region, so that smoothing performance sometimes decreases. Similarly, the smoothing performance sometimes decreases in also a high-SOC region. Therefore, determination accuracy of the micro short circuit can be restrained from decreasing by limiting the range described above. Incidentally, the target battery block is controlled to be charged/discharged in order to return to the intermediate region or the method of micro short circuit detection is switched to another method when the voltage/SOC of the target battery block deviates from the intermediate region described above.

Further, according to the exemplary embodiment described above, an example in which a smoothing period is set to longer, as more than or equal to 10 hours, to increase the determination accuracy is assumed. In this respect, the smoothing period may be set to shorter, as 1 to 2 hours, and when present difference (i) is compared with previous difference (i), previous difference (i) that goes back a longer period may be used to increase the determination accuracy.

Incidentally, the exemplary embodiment may be identified with items described below.

[Item 1]

Management device (10) configured to manage power storage module (20) including n power storage blocks (B1 to Bn) series-connected, where n is an integer of 2 or greater, each of the power storage blocks containing m power storage cells (S11 to Snm) parallel-connected, where m is an integer of 1 or greater, management device (10) including:

voltage detector (11) that detects each voltage of n power storage blocks (B1 to Bn);

smoothing unit (13a) that smoothes the detected voltage of each of power storage blocks (B1 to Bn) based on previous data during a certain period;

calculator (13b) that calculates difference between a smoothing voltage of one power storage block (B1) in n power storage blocks (B1 to Bn) and a representative value of smoothing voltages of the other power storage blocks (B2 to Bn) or all power storage blocks (B1 to Bn); and determination unit (13c) that determines power storage block (B1) whose difference against the representative value enlarges more than or equal to a set value during a predetermined period as power storage block (B1) containing abnormal power storage cell (S11).

According to Item 1, it is possible to detect abnormality in the power storage cell without considering a state of an electric current.

[Item 2]

In management device (10) according to Item 1, smoothing unit (13a) smoothes the detected voltage of each of power storage blocks (B1 to Bn) based on previous data during more than or equal to 10 hours.

According to Item 2, influence of charge and discharge status can be removed from the detected value.

[Item 3]

In management device (10) according to Item 1 or 2, calculator (13b) calculates difference between the smoothing voltage of one power storage block (B1) in n power storage blocks (B1 to Bn) and a median of the other power storage blocks (B2 to Bn).

According to Item 3, the determination accuracy of detecting the abnormality can be restrained from decreasing.

Namely, even though measurement accuracy of a voltage measuring device is low, the decrease in the determination accuracy of the micro short circuit can be suppressed.

[Item 4]

Management device (10) configured to manage power storage module (20) including n power storage blocks (B1 to Bn) series-connected, where n is an integer of 2 or greater, each of the power storage blocks containing m power storage cells (S11 to Snm) parallel-connected, where m is an integer of 1 or greater, management device (10) including:

voltage detector (11) that detects each voltage of n power storage blocks (B1 to Bn);

smoothing unit (13a) that smoothes a state of charge (SOC) based on the detected voltage of each of the power storage blocks (B1 to Bn), based on previous data during a certain period;

calculator (13b) that calculates a difference between a smoothing SOC of one power storage block (B1) in the n power storage blocks (B1 to Bn) and a representative value of smoothing SOCs of the other power storage blocks (B2 to Bn) or all the power storage blocks (B1 to Bn); and determination unit (13c) that determines power storage block (B1) whose difference against the representative value enlarges more than or equal to a set value during a predetermined period as power storage block (B1) containing abnormal power storage cell (S11).

According to Item 4, it is possible to detect abnormality in the power storage cell without considering a state of an electric current.

[Item 5]

In management device (10) according to Item 1 or 4, smoothing processing by smoothing unit (13a), calculation processing of the difference by calculator (13b), and determination processing by the determination unit (13c) are executed when the voltage of power storage block (B1) fits within a predetermined range, and are stopped when the voltage of power storage block (B1) deviates from the predetermined range.

According to Item 5, determination accuracy of power storage block (B1) containing abnormal power storage cell (S11) can be restrained from decreasing.

[Item 6]

In management device (10) according to Item 1 or 4, smoothing processing by smoothing unit (13a), calculation processing of the difference by calculator (13b), and determination processing by determination unit (13c) are executed when an SOC of power storage block (B1) fits within a predetermined range, and are stopped when the SOC of power storage block (B1) deviates from the predetermined range.

According to Item 6, determination accuracy of power storage block (B1) containing abnormal power storage cell (S11) can be restrained from decreasing.

[Item 7]

Power storage system (1) including;

power storage module (20); and management device (10) according to any one of Items 1 to 6, that manages power storage module (20).

According to Item 7, it is possible to detect abnormality of power storage cell without considering a state of an electric current.

The invention claimed is:

1. A management device configured to manage a power storage module including n power storage blocks series-connected, where n is an integer of 2 or greater, each of the power storage blocks containing m power storage cells parallel-connected, where m is an integer of 2 or greater, the management device comprising:

a voltage detector that detects each voltage of the n power storage blocks;

a smoothing unit that smoothes the detected voltage of each of the power storage blocks based on previous data during a certain period;

a calculator that calculates a difference between a smoothing voltage of one power storage block in the n power storage blocks and a representative value of smoothing voltages of one or more of the other power storage blocks of the n power storage blocks; and a determination unit that determines a power storage block whose difference against the representative value enlarges more than or equal to a set value during a predetermined period as a power storage block containing an abnormal power storage cell.

2. The management device according to claim 1, wherein the smoothing unit smoothes the detected voltage of each of the power storage blocks based on previous data during more than or equal to 10 hours.

3. The management device according to claim 1, wherein the calculator calculates a difference between the smoothing voltage of one power storage block in the n power storage blocks and a median of the other power storage blocks.

4. The management device according to claim 1, wherein smoothing processing by the smoothing unit, calculation processing of the difference by the calculator, and determination processing by the determination unit are executed when the voltage of the power storage block fits within a predetermined range, and are stopped when the voltage of the power storage block deviates from the predetermined range.

5. The management device according to claim 1, wherein smoothing processing by the smoothing unit, calculation processing of the difference by the calculator, and determination processing by the determination unit are executed when an SOC of the power storage block fits within a predetermined range, and are stopped when the SOC of the power storage block deviates from the predetermined range.

6. A power storage system comprising:
a power storage module; and
the management device according to claim 1, that manages the power storage module.

7. A management device configured to manage a power storage module including n power storage blocks series-connected, where n is an integer of 2 or greater, each of the power storage blocks containing m power storage cells parallel-connected, where m is an integer of 2 or greater, the management device comprising:

a voltage detector that detects each voltage of the n power storage blocks; a smoothing unit that smoothes a state of charge (SOC) based on the detected voltage of each of the power storage blocks, based on previous data during a certain period;

a calculator that calculates a difference between a smoothing SOC of one power storage block in the n power storage blocks and a representative value of smoothing SOCs of one or more of the other power storage blocks of the n power storage blocks; and a determination unit that determines a power storage block whose difference against the representative value enlarges more than or equal to a set value during a predetermined period as a power storage block containing an abnormal power storage cell.

8. The management device according to claim 7, wherein smoothing processing by the smoothing unit, calculation processing of the difference by the calculator, and determination processing by the determination unit are executed when the voltage of the power storage block fits within a predetermined range, and are stopped when the voltage of the power storage block deviates from the predetermined range.

9. The management device according to claim 7, wherein smoothing processing by the smoothing unit, calculation processing of the difference by the calculator, and determination processing by the determination unit are executed when an SOC of the power storage block fits within a predetermined range, and are stopped when the SOC of the power storage block deviates from the predetermined range.

10. A power storage system comprising:
a power storage module; and
the management device according to claim 7, that manages the power storage module.

* * * * *